US007187244B2

(12) United States Patent
Ribarich et al.

(10) Patent No.: US 7,187,244 B2
(45) Date of Patent: Mar. 6, 2007

(54) DIGITAL LIGHT BALLAST OSCILLATOR

(75) Inventors: Thomas J. Ribarich, Laguna Beach, CA (US); Peter Green, Redondo Beach, CA (US); Muthu Subaramanian, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 89 days.

(21) Appl. No.: 10/792,167

(22) Filed: Mar. 2, 2004

(65) Prior Publication Data

US 2004/0233001 A1 Nov. 25, 2004

Related U.S. Application Data

(60) Provisional application No. 60/451,977, filed on Mar. 3, 2003.

(51) Int. Cl.
*H03K 3/36* (2006.01)

(52) U.S. Cl. .................. 331/111; 331/143; 331/113 R; 331/129; 331/130

(58) Field of Classification Search ................ 331/111, 331/143, 113 R, 129, 130, 131, 34; 315/DIG. 4, 315/307

See application file for complete search history.

(56) References Cited

U.S. PATENT DOCUMENTS

| | | | | | |
|---|---|---|---|---|---|
| 4,692,717 | A * | 9/1987 | Ouyang et al. | ............. | 331/111 |
| 4,734,650 | A * | 3/1988 | Alley et al. | ................. | 324/414 |
| 5,850,127 | A * | 12/1998 | Zhu et al. | .................... | 315/307 |
| 6,191,630 | B1 | 2/2001 | Ozawa et al. | ............... | 327/278 |
| 6,456,170 | B1 * | 9/2002 | Segawa et al. | ............. | 331/143 |
| 2004/0164777 | A1 * | 8/2004 | Yasuda | ....................... | 327/156 |

FOREIGN PATENT DOCUMENTS

JP 01157612 * 6/1989

* cited by examiner

*Primary Examiner*—Michael B Shingleton
(74) *Attorney, Agent, or Firm*—Ostrolenk, Faber, Gerb & Soffen, LLP

(57) ABSTRACT

An oscillator for a power converter control outputs a pulse train based on a charging time of a capacitor linked to a variable current source. A digital to analog converter (DAC) controls the variable current source in conjunction with a switch to determine the charging time of the capacitor. By varying the digital DAC input, the charging time of the capacitor is modified, thereby modifying the frequency of the pulse train. A comparator compares the capacitor voltage to a toggled threshold, which switches depending on whether the capacitor is charging or discharging. The comparator output supplies the pulse train that can be used in a half bridge switching arrangement for the power converter, which can also serve as an electronic ballast for a lamp.

3 Claims, 9 Drawing Sheets

70

DIGITAL LIGHT BALLAST OSCILLATOR

RELATED APPLICATIONS

The present application is based on and claims benefit of U.S. Provisional Application No. 60/451,977, filed Mar. 3, 2003, entitled Digital Lighting Ballast Oscillator, to which a claim of priority is hereby made.

BACKGROUND OF THE INVENTION

1. Field of the Invention

The present invention relates generally to electronic ballasts for fluorescent lamps, and relates more particularly to electronic ballast controls with adjustable oscillators.

2. Description of Related Art

Electronic ballasts for fluorescent lighting applications are widely available and well known, particularly those that operate with a switching half-bridge. Such an electronic ballast is illustrated in U.S. Pat. No. 6,008,593 to International Rectifier Corporation. Electronic ballast controls have evolved to include a wide range of functionality and features including power factor correction and fault detection and response circuitry.

A typical electronic ballast that includes a switching half-bridge provides an oscillator that is used to derive the switching signals for the half-bridge to appropriately direct current to various components at particular times to establish desired power flow to the fluorescent lamp. One type of implementation of an electronic ballast using an oscillator involves connecting a voltage controlled oscillator (VCO) into the electronic ballast and driving the VCO with an appropriate signal to modify the switching frequency as desired. For example, in the case of fluorescent lamp dimming applications, the switching frequency of the electronic ballast can be adjusted to obtain particular dimming settings.

The use of a VCO in an electronic ballast entails a number of design challenges that include appropriately providing the input to the VCO to obtain the desired oscillating frequency. In addition, a feedback from the output stage of the electronic ballast is typically desired so that appropriate control for the electronic ballast can be maintained with the VCO. When supplying a VCO in an integrated control solution for an electronic ballast, the VCO can take up a large amount of room relative to the other components in the integrated solution.

It would be desirable to obtain a simple oscillator that can be easily controlled and implemented in a simplistic fashion to provide an oscillator function for switching a half-bridge in an electronic ballast.

SUMMARY OF THE INVENTION

According to the present invention, a simple programmable oscillator is provided that provides an oscillator function for driving a switching half-bridge circuit in an electronic ballast. The oscillator is digitally programmable to obtain a set frequency, with other parameters such as minimum frequency being user selectable. The frequency is selectable in increments over an operating range through the use of a D/A converter (DAC).

An advantage obtained through the present invention includes minimizing frequency variations over temperature and processes to within plus or minus 5% of the set frequency. Another advantage of the configuration of the present invention permits the minimum frequency to be set with a single resistor that is external to the integrated ballast control. The DAC provides a frequency variation range adjustable up to the limit of the granularity of the DAC, in combination with the set minimum frequency obtained through the external resistor value.

In accordance with another advantage of the present invention, the electronic ballast control includes an internal voltage reference that provides an operational reference to minimize process and temperature variations in the control. The voltage reference permits parameters such as the oscillating frequency to be corrected to within a precise range.

The oscillator of the present invention operates by charging a capacitor with a comparator, the threshold of which is modified to obtain a charging or discharging cycle. Different voltage references are applied to the input of the comparator as the capacitor charges and discharges to obtain a pulsed output with a frequency dependent upon the rate at which the capacitor charges. The charging rate for the capacitor is set by the DAC, with the minimum frequency set by the external resistor. That is, when the DAC has zero or a low state on each of its inputs, the minimum frequency is that which is set according to the value of the external resistor.

A wide range of frequencies are available based on the DAC settings and the programmed minimum frequency. The pulsed output of the oscillator is used to provide gate signals for switching a half-bridge switching circuit to obtain an appropriate control for an electronic ballast. The electronic ballast is operable at a number of distinct frequencies for precise power control that is advantageous in dimming applications. It should be apparent that the oscillator of the present invention is not limited to electronic ballast control, but is also useful in a number of other applications where a simple and precisely controlled oscillator is desired.

In accordance with the present invention, the oscillator circuit can be made responsive to fault detection circuitry to turn off the oscillator, or set the frequency to a default state. Other features and advantages of the present invention are described in greater detail below with reference to the accompanying drawings.

DETAILED DESCRIPTION OF THE FIGURES

Figure 1:
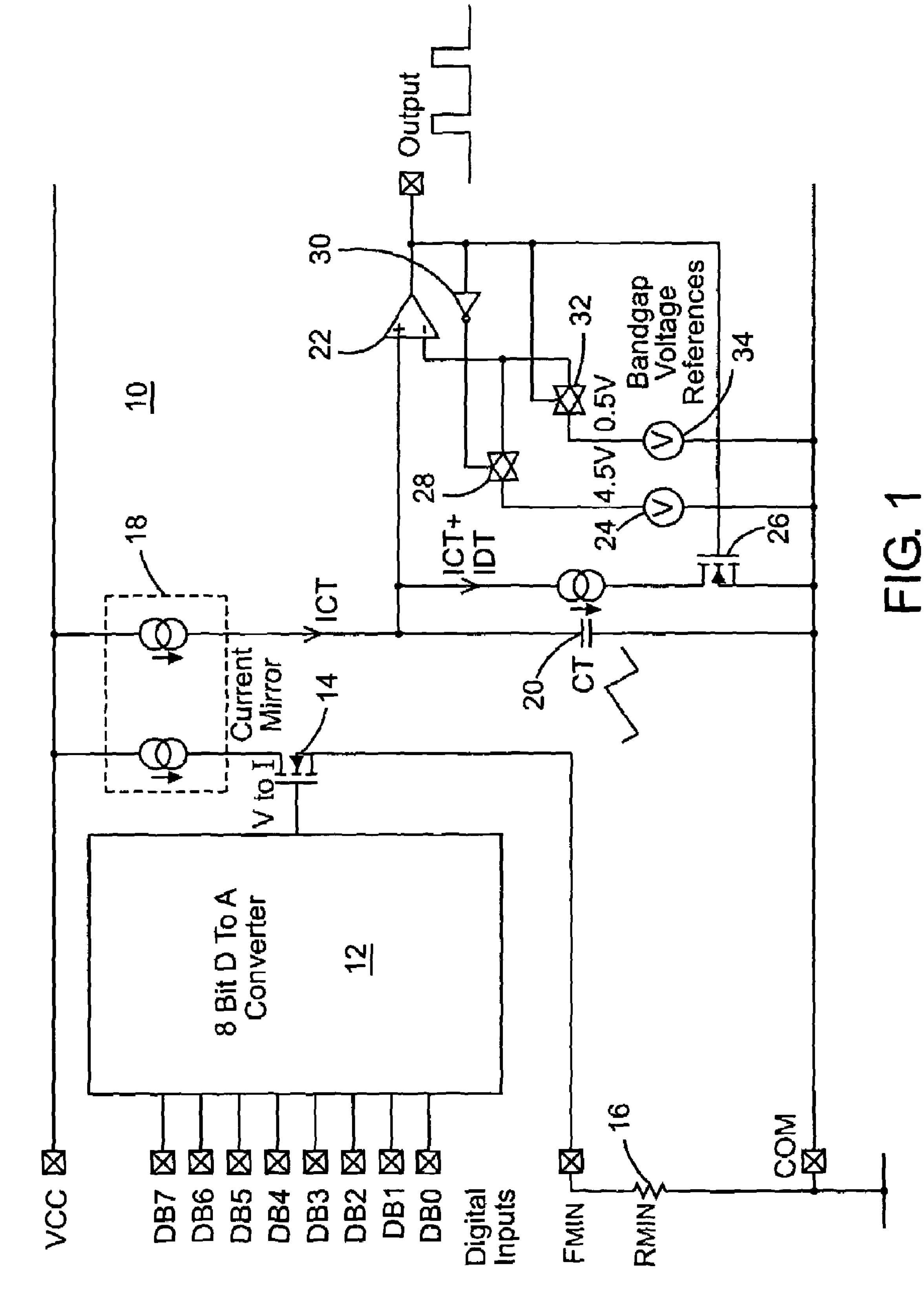
FIG. 1 shows a circuit diagram for a circuit according to the present invention.

FIG. 1 shows a preferred embodiment of a circuit 10 according to the present invention. As shown by FIG. 1, circuit 10 according to the preferred embodiment of the present invention includes a digital to analog converter DAC 12. DAC 12 in the preferred embodiment of the present invention is an eight bit converter. However, other D/A converters such as 12-bit converters can be used without deviating from the present invention as will be described below.

The output of DAC 12 is connected to the gate electrode of MOSFET 14. Thus, the operation of MOSFET 14 is controlled through the DAC 12. The source electrode of MOSFET 14 is series-connected with resistor 16, which is electrically connected at the other node thereof to the ground. The drain electrode of MOSFET 14 is connected to a current mirror circuit 18, which in turn is connected to the input voltage. When DAC 12 turns on MOSFET 14, current flows through resistor 16. At the same time, the same current flows to capacitor 20, which is connected between current mirror 18 and ground. Thus, the current from the current mirror 18 charges capacitor 20. Because the time required for charging capacitor 20 depends on the amount of current it receives, by setting the value of resistor 16, the minimum amount of current received by capacitor 20 may be set by selecting an appropriate resistance value for resistor 16, thereby the minimum charge time (which may be used to set the minimum frequency) for capacitor 20 may be set by the selection of resistor 16. In the preferred embodiment of the present invention, resistor 16 is an external resistor which may be selected by the user. Specifically, according to the preferred embodiment of the present invention, circuit 10, with the exception of resistor 16, is formed in a single semiconductor chip, and resistor 16 is selected by the user to form circuit 10.

Figure 2:
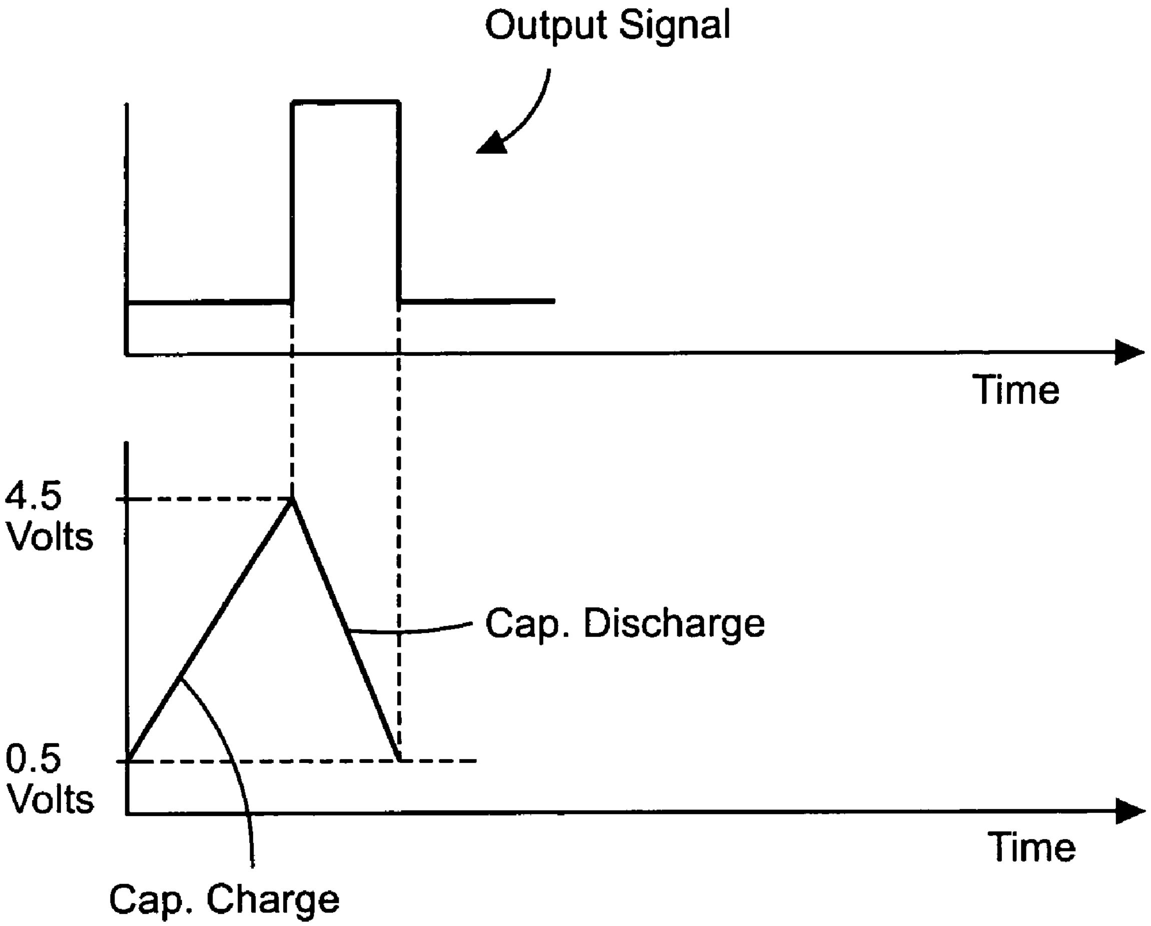
FIG. 2 shows the charge/discharge cycle of the capacitor in a circuit according to the present invention which controls the frequency of the output signal.

When the charge in capacitor 20 reaches an appropriate level, i.e., when capacitor 20 is charged to a desired maximum voltage, capacitor 20 is discharged until it reaches another appropriate charge level, i.e., a minimum voltage value. As a result, an oscillating wave form is created, which is then outputted appropriately. Specifically, circuit 10 includes a single comparator 22 which compares the voltage across capacitor 20 to a first reference voltage source 24. As long as the voltage across capacitor 20 remains below the reference voltage provided by the first reference voltage source 24, the output signal is low as shown in FIG. 2. When voltage across capacitor 20 reaches a value above the voltage provided by the first reference voltage source 24, the output signal turns MOSFET 26 ON. As a result, capacitor 20 is discharged to ground through MOSFET 26. The current which is discharged includes the current (ICT) which is received from current mirror 18 and the charge in capacitor 20 (IDT). Thus, capacitor 20 charges up with ICT (which is set by resistor 16) and discharges with IDT. Such an arrangement contributes to the speed of the circuit. It should be noted that IDT corresponds to the pulse width of the output signal.

When it is determined that voltage across capacitor 20 has reached a value above the voltage set by first voltage reference 24, the output signal is shifted from the digital low to a digital high. As a result, the transmission gate 28 receives no signal due to the presence of inverter 30, thereby disconnecting first voltage reference from comparator 22. At the same time, transmission gate 32 is turned ON, thereby connecting second voltage reference source 34 to comparator 22. At this point, comparator 22 compares the voltage across capacitor 20 to the voltage provided by the second voltage reference 32. When the voltage across capacitor 20 reaches a voltage provided by the second voltage reference source 34, a low signal is outputted which in turn, turns off transmission gate 32 to cut off second voltage reference source 34 and turns on transmission gate 28 (due to the presence of inverter 30) thereby connecting first voltage reference source 24 to comparator 22. In addition, MOSFET 26 is turned off which allows capacitor 20 to charge up again. As a result, the output pattern shown in FIG. 2 is generated by the charging and discharging of capacitor 20. Therefore, as stated earlier, the minimum frequency may be set by selecting a proper resistance value for resistor 16.

Figure 3:
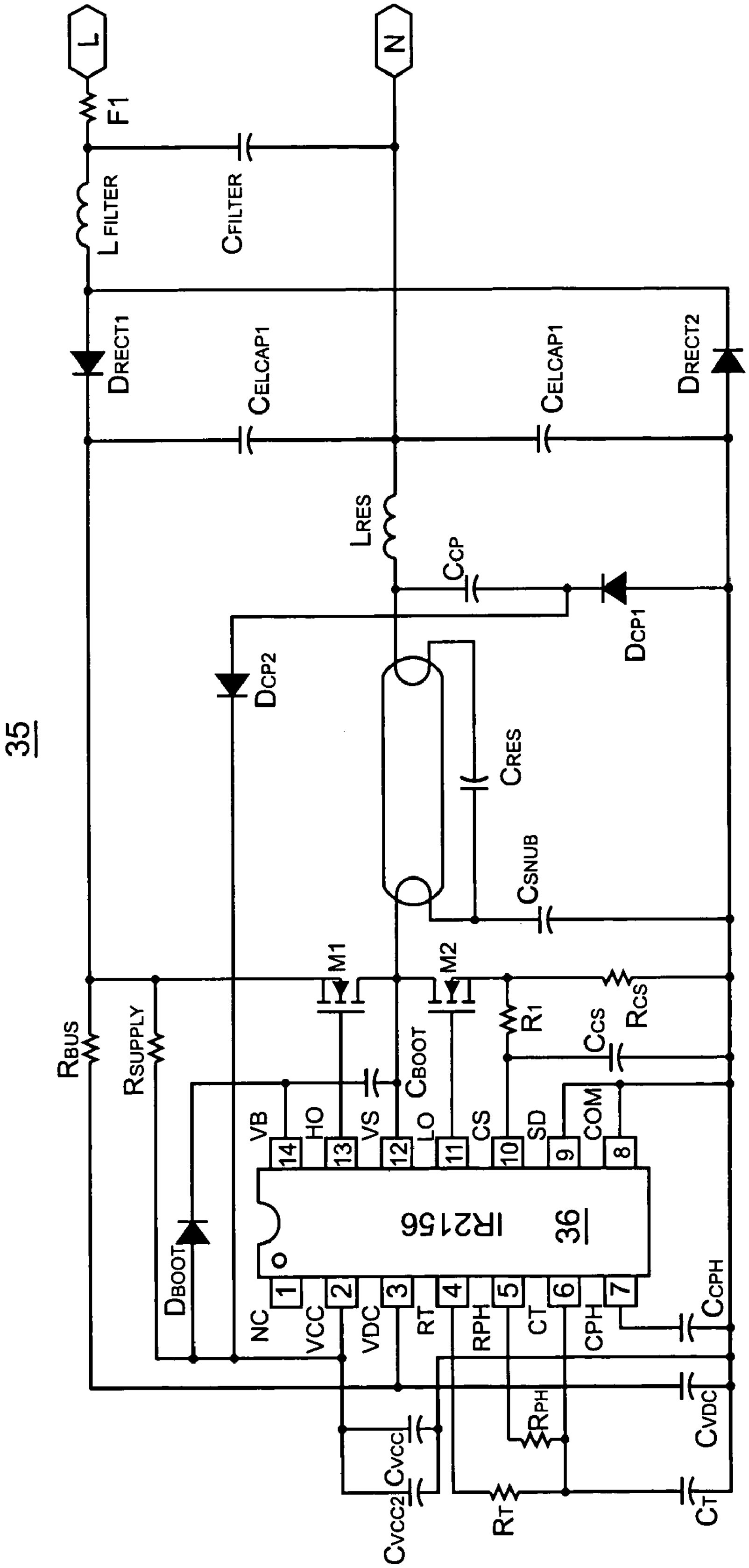
FIG. 3 is a circuit diagram of an electronic ballast with a control IC usable with the present invention.

The output of circuit 10 may be utilized to drive two MOSFETs in a half-bridge configuration. For example, the output may be toggled between two MOSFETs in a half-bridge configuration. A conventional arrangement showing a known driver that drives MOSFETs in a half-bridge arrangement is illustrated in FIG. 3 as a circuit 35. Circuit 10 in this instance may be incorporated into a control IC 36 that may be used to drive two MOSFETs in a half-bridge arrangement. One skilled in the art could also adopt the present invention for other applications without deviating from the principles of the invention.

In some applications, such as in an electronic ballast, it is desirable to vary the frequency slowly. Using the method of the present invention which is embodied in circuit 10, the minimum frequency may be set by an external resistor, and may be varied digitally. For example, when all digital inputs to D/A converter 12 are low, the minimum frequency depends on the value of resistor 16. The frequency can then be varied by programming. For example, digital inputs can be provided to D/A converter 12 to vary the frequency linearly over a range. The resolution, i.e., the amount of the frequency change, would then depend on the incremental changes (the smaller the increments, the better the resolution). Thus, if a 12-bit D/A converter is used instead of an 8-bit D/A converter, the resolution may be improved in that the increments can be made smaller.

Referring now to FIG. 3, a typical electronic ballast circuit with a control IC driving a switching half-bridge is illustrated as circuit 35. The gating for switches M1 and M2 are provided by control IC 36 on outputs HO and LO, respectively. The gating signals on outputs HO and LO may be derived in accordance with the present invention from the oscillator output illustrated in circuit 10 of FIG. 1.

Figure 4:
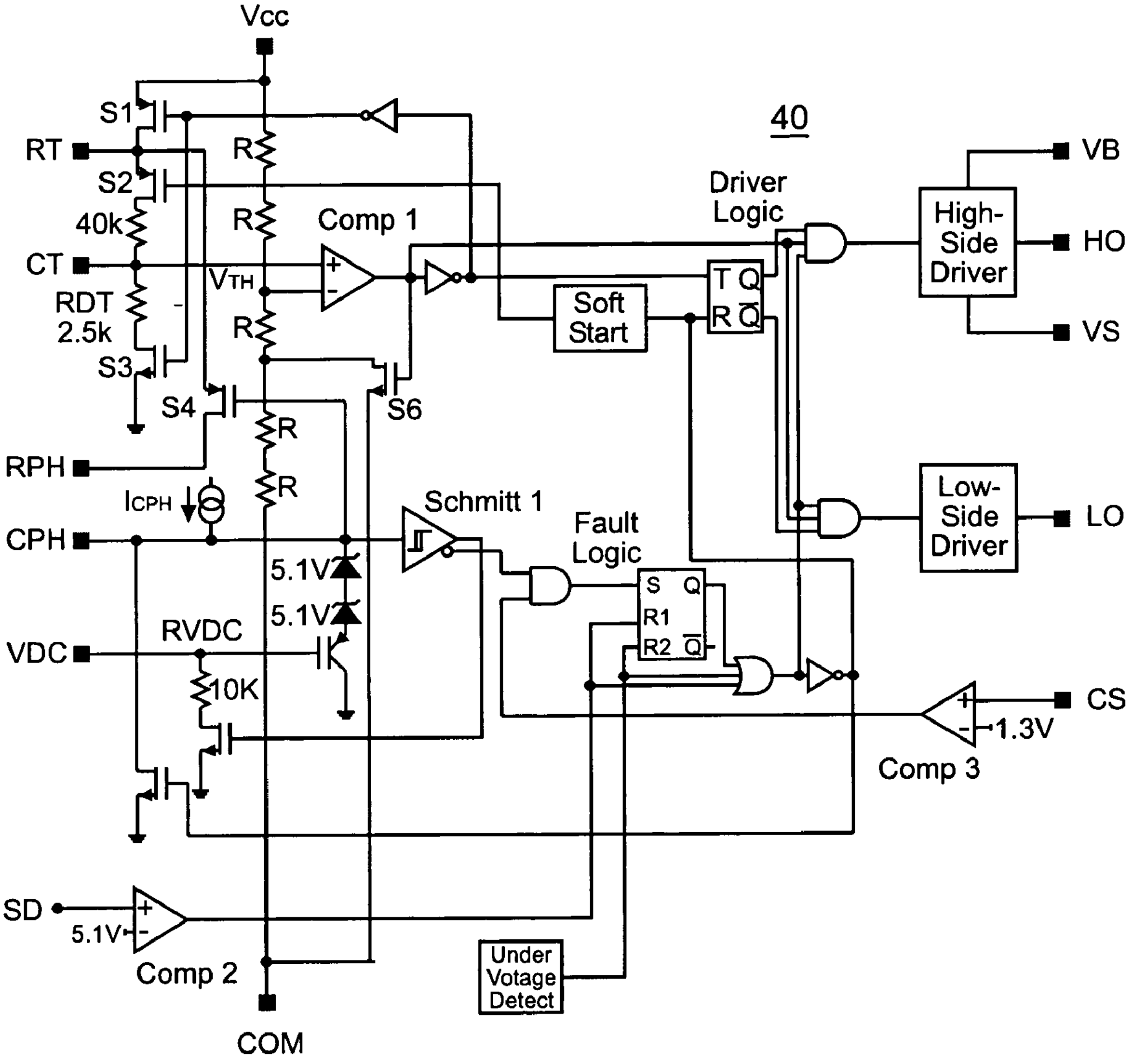
FIG. 4 is a schematic block diagram of a conventional electronic ballast control.

Referring now to FIG. 4, a block diagram of the function of control IC 36 is illustrated generally as diagram 40. In this prior configuration, oscillation timing is achieved through operation of comparator COMP 1 with externally set component parameters including resistor RT and capacitor CT illustrated in FIG. 3. The output of comparator COMP 1 in diagram 40 is used to alternately switch the circuits for high and low side drivers HO and LO, respectively. According to this configuration, half-bridge switches M1 and M2 are complementary switched at the same frequency. The oscillator according to the present invention may be incorporated into the circuit replacing COMP 1 and several other components.

Figure 5:
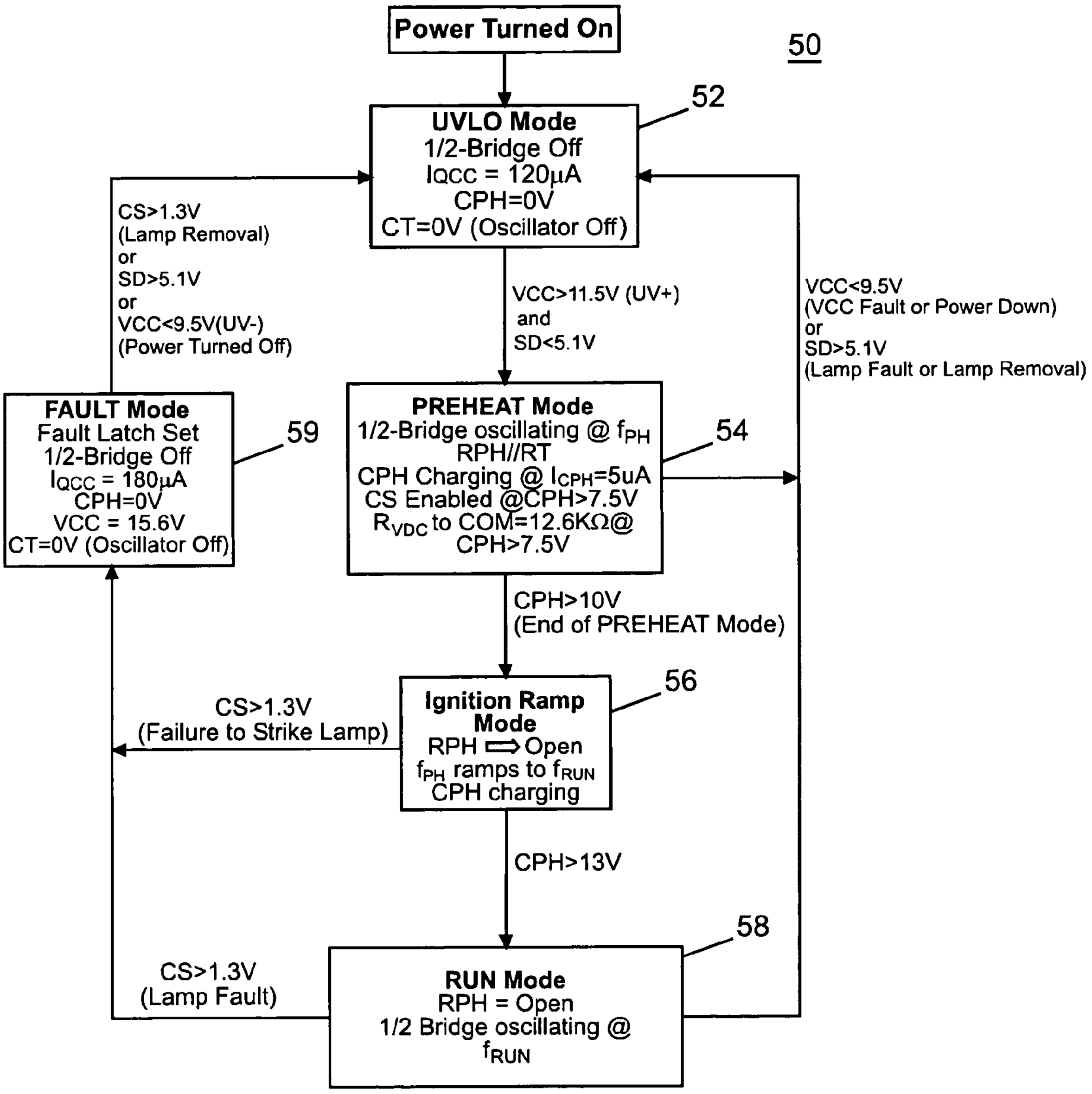
FIG. 5 is a state diagram for operation of the electronic ballast control of FIG. 4.

Referring now to FIG. 5, a state diagram for operation of control IC 36 is illustrated generally as diagram 50. In accordance with diagram 50, after power is turned on to the electronic ballast, control IC 36 enters undervoltage lockout (UVLO) mode in state 52. In this state, the half-bridge is not switched, i.e., it is turned off, a quiescent current of approximately 120 μA is supplied to permit circuit operation at a very low level, preheat capacitor voltage is zero and the voltage on capacitor CT is zero, indicating the oscillator is off. With the oscillator according to the present invention, the oscillator is simply disabled, for example. During state 52, in normal operation, energy is supplied to components in the electronic ballast, which drives the electronic ballast to an initial start up condition. Accordingly, once VCC is greater than 11.5V, the undervoltage high threshold UVLO+, and the voltage on pin SD is greater than 5.1V, indicating normal operation without the need of a shutdown, control IC 36 transitions to state 54 to begin preheat mode.

In preheat mode in state 54, a switching half-bridge is started in oscillation mode at a preheat frequency, fPH. During preheat mode resistor RPH is placed in parallel with resistor RT to set the preheat frequency for heating the filaments of the lamp in the electronic ballast. With the oscillator according to the present invention, a digital value is placed on the inputs to DAC 12 to set fPH. Also in preheat mode of state 54, preheat capacitor CPH charges with a current of approximately 5 μA to set a preheat mode application time for the circuit. During preheat mode, current sensing is enabled once the voltage on capacitor CPH is greater than 7.5V. The current sense enable is delayed until this point to prevent reaction to potential overcurrent conditions that can occur during preheat mode. Also during preheat mode in state 54, the resistance path for resistor RVDC to ground, or COM, is set to approximately 12.6 kΩ when the voltage on capacitor CPH reaches approximately 7.5V. Control IC 36 exits preheat mode of state 54 in normal operation when the voltage on capacitor CPH, and thus pin CPH, is greater than 10V. Alternatively, control IC 36 transitions from state 54 to state 52 when a fault is detected, including an input power fault where VCC is less than 9.5V, or a lamp fault where SD is greater than 5.1V.

At the end of preheat mode in normal operation, control IC 36 transitions from state 54 to state 56 for ignition of the lamp. During ignition mode, resistor RPH is disconnected from resistor RT to change the frequency setting for switching the half-bridge. Accordingly, the frequency ramps from fPH to fRUN as resistor RPH is slowly disconnected from resistor RT. The oscillator according to the present invention permits the switching frequency to be changed gradually with varying digital inputs to DAC 12. During ignition mode, capacitor CPH continues to charge, and an ignition of the lamp is expected when the voltage on capacitor CPH is greater than 13V. In this instance, control IC 36 transitions from state 56 to state 58 for a normal run mode. Alternatively, if the lamp fails to ignite in state 56, pin CS sees a voltage of greater than 1.3V, indicating a fault, which transitions the operation of control IC 36 from ignition mode in state 56 to fault mode in state 59.

During normal running conditions in run mode of state 58, the half-bridge oscillates at the set frequency fRUN and resistor RPH is completely disconnected from resistor RT. This frequency is set according to the present invention by supplying a desired digital value to DAC 12. During normal run mode, the lamp continues to operate until there is a power disruption or a lamp fault. In the case of a power disruption, if VCC drops below 9.5V control IC 36 transitions from state 58 to state 52 to return the electronic ballast to UVLO mode. In addition, there is a lamp fault, or the lamp is removed from the electronic ballast, the voltage on pin SD increases to above 5.1V and control IC 36 again transitions from state 58 to state 52, to UVLO mode.

If there is an overcurrent fault in the lamp, the voltage on pin CS increases to above 1.3V in run mode state 58, causing a transition to state 59 where control IC 36 enters fault mode. In fault mode, a fault latch is set, the half-bridge is turned off and a quiescent current of approximately 180 μA is supplied to maintain control IC 36 active. The voltages on capacitor CPH and CT is set to zero volts, so that the oscillator is turned off. According to the oscillator of the present invention, the oscillator is simply disabled with a fault switch, for example. Control IC 36 remains in state 59 until a lamp fault or power disruption returns control IC to state 52, UVLO mode.

Figure 6:
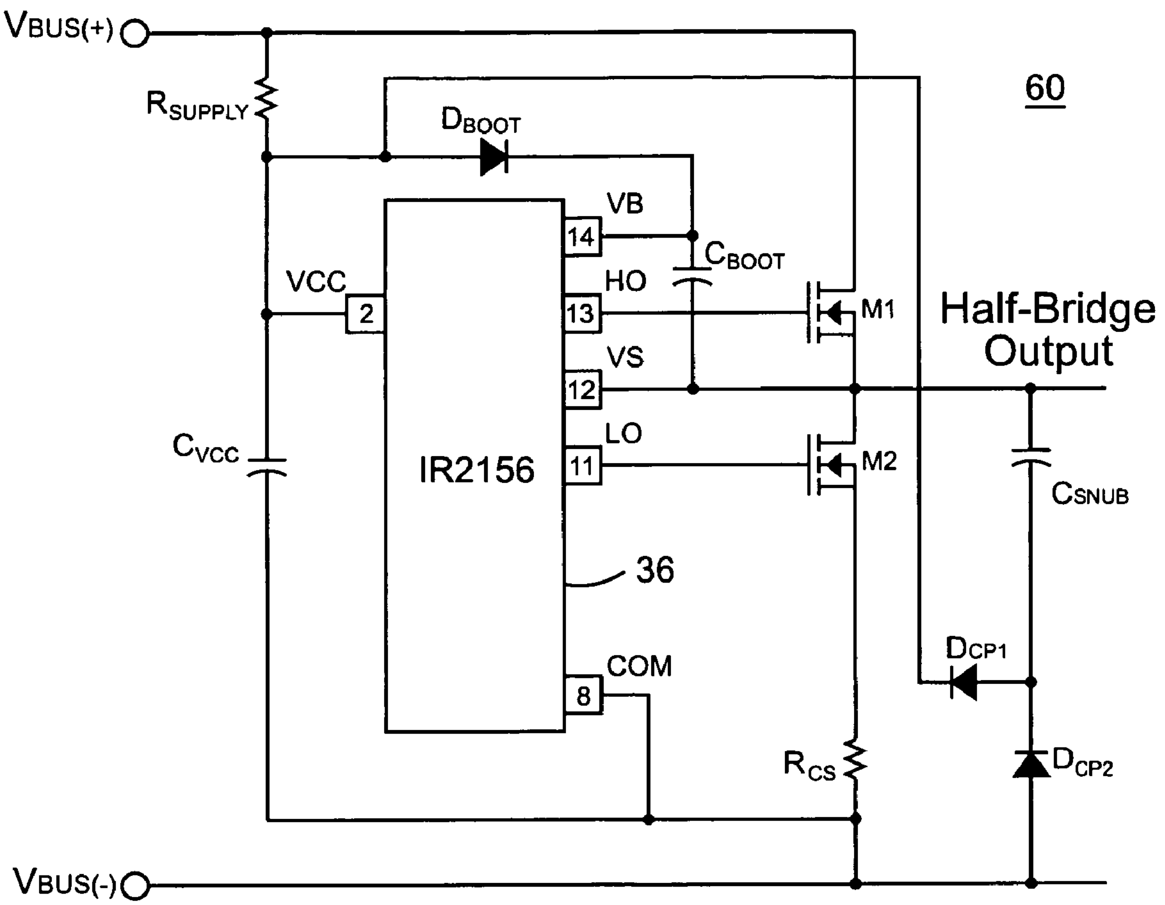
FIG. 6 is a circuit diagram illustrating a start up feature for an electronic ballast control.

Referring now to FIG. 6, a diagram of features related to UVLO mode is illustrated generally as circuit 60. IC 36 enters UVLO mode when the voltage on VCC is below the turn on threshold of control IC 36. UVLO mode is designed to maintain a low quiescent supply current of less than approximately 200 μA to keep control IC 36 fully functional prior to initiating oscillation in the high and low side output drivers. Circuit 60 shows a start up configuration for charging components in the electronic ballast to obtain appropriate operating conditions prior to initiating oscillation in the switching half-bridge. Start up capacitor CVCC is charged by current through supply resistor RSUPPLY minus the start up current drawn by control IC 36. Resistor RSUPPLY has a value that is chosen to provide twice the maximum start up current, for example, to obtain a start up condition even when a low lying input voltage condition exists. Once the voltage on capacitor CVCC reaches a start up threshold, and pin SD is below 4.5V, control IC 36 turns on and begins to oscillate the switching half-bridge with gate outputs HO and LO. As the switching half-bridge begins to oscillate, capacitor CVCC begins to discharge with the extra current drawn by the switching half-bridge.

Figure 7:
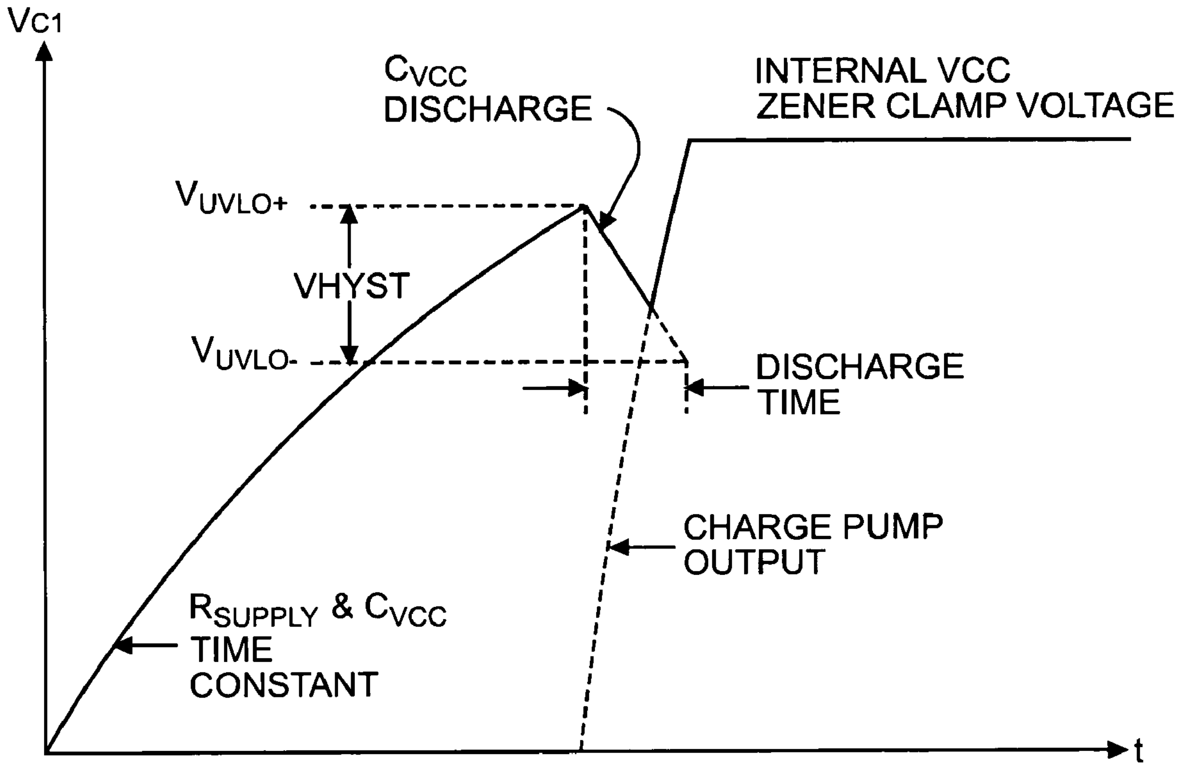
FIG. 7 is a graph illustrating start up supply voltage for an electronic ballast control.

Referring now to FIG. 7, a graph illustrating the start up voltage on capacitor CVCC is shown generally as graph 70. The voltage on capacitor CVCC charges during start up until the threshold for turn on for control IC 36 is reached, shown as VUVLO+ in graph 70. At that point, the switching half-bridge is activated and capacitor CVCC begins to discharge. At the same time, the charge pump circuitry in diagram 60 provides a rectified current to charge capacitor CVCC at a particular point in the discharge cycle. Once capacitor CVCC is charged to a certain level, internal voltage regulation controls the voltage on capacitor CVCC in conjunction with the charge pump circuitry. A boot strap diode DBOOT and supply capacitor CBOOT provide the supply voltage for the high side driver circuitry. The high side supply is charged prior to a first pulse supplied by pin HO, so control IC 36 causes a first gate signal to be supplied on pin LO to provide extra time for the high side supply to be charged. During UVLO mode, high and low side driver outputs HO and LO are set to a low value to disable the switching half-bridge, and capacitor CT is connected internally to a common voltage reference to disable the oscillator, for example. Other disabling techniques in keeping with the present invention are readily available as well. In addition, pin CPH is internally connected to a common voltage level to reset the preheat time.

Figure 8:
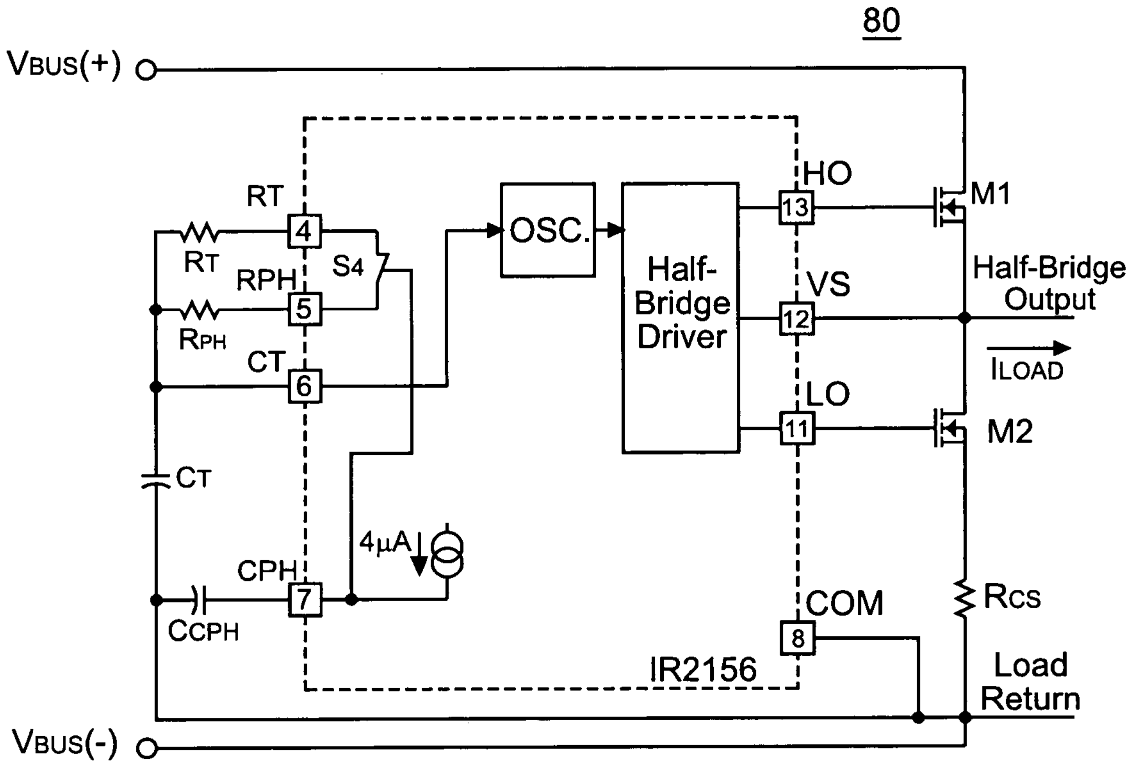
FIG. 8 is a block diagram illustrating a preheat feature for an electronic ballast control.

Referring now to FIG. 8, a diagram illustrating the circuitry involved in preheat mode is illustrated generally as circuit 80. During preheat mode, filaments of the lamp are heated to a temperature appropriate for ignition and operation. This procedure helps to increase lamp life while reducing ignition voltage requirements. Preheat mode is entered once UVLO mode is exited when the supply voltage reaches an appropriate threshold of VUVLO+. During this preheat mode, gate signal outputs HO and LO begin to oscillate at the preheat frequency with a 50% duty cycle and a dead time set by internal dead time resistor RDT. In accordance with the present invention, the preheat frequency is set with a digital preheat value applied to DAC 12. Initially, pin CPH is disconnected from COM and an internal 4 μA current source charges preheat timing capacitor CCPH linearly. Also at this stage, overcurrent protection is disabled. In the prior configuration, the switching frequency for the preheat mode is determined by the parallel combination of resistors RT and RPH, along with the charging of timing capacitor CT. Capacitor CT charges and discharges between ⅓ and ⅗ of VCC at an exponential trajectory through the parallel combination of resistors RT and RPH that are connected internally to voltage VCC. The charge time of capacitor CT from ⅓ to ⅗ VCC determines the on time of the respective output gate driver, HO or LO. When the voltage on capacitor CT exceeds ⅗ of voltage VCC, resistors RT and RPH are disconnected from VCC. Capacitor CT is discharged exponentially through an internal resistor RDT from ⅗ to ⅓ ov voltage VCC, which provides the dead time for the gate driver outputs HO and LO. The selection of the values for the components capacitor CT and resistor RDT determine the desired dead time. The relationship between desired dead time and the value of capacitor CT is provided in equation 1.

$$t_{DT}=C_t \cdot 1475 \text{ [Seconds]} \qquad (1)$$

Once the voltage on capacitor CT discharges below ⅓ of the voltage VCC, resistor RDT is disconnected from COM and resistors RT and RPH are again connected to voltage VCC to begin charging time and capacitor CT. The above configuration provides a set frequency for preheat mode to the charging and discharging of capacitor CT. This functionality is achieved according to the present invention by programming DAC 12 to obtain a selectable preheat frequency, in conjunction with an upper and lower threshold value alternately applied to comparator 22 as shown in FIG. 1. Accordingly, the operation of switch S4, resistor RT, resistor RPH and external capacitor CT can be eliminated. Oscillating gate signals are supplied on outputs HO and LO at the preheat frequency during the remainder of preheat mode, until the voltage on pin CPH exceeds 13V, at which point control IC 36 enters ignition mode. As described in the state diagram, overcurrent protection and undervoltage reset protection are disabled in preheat mode until the voltage on pin CPH exceeds 7.5V. This precaution prevents spurious fault detection during preheat mode that may cause the oscillator to turn off otherwise.

Figure 9:
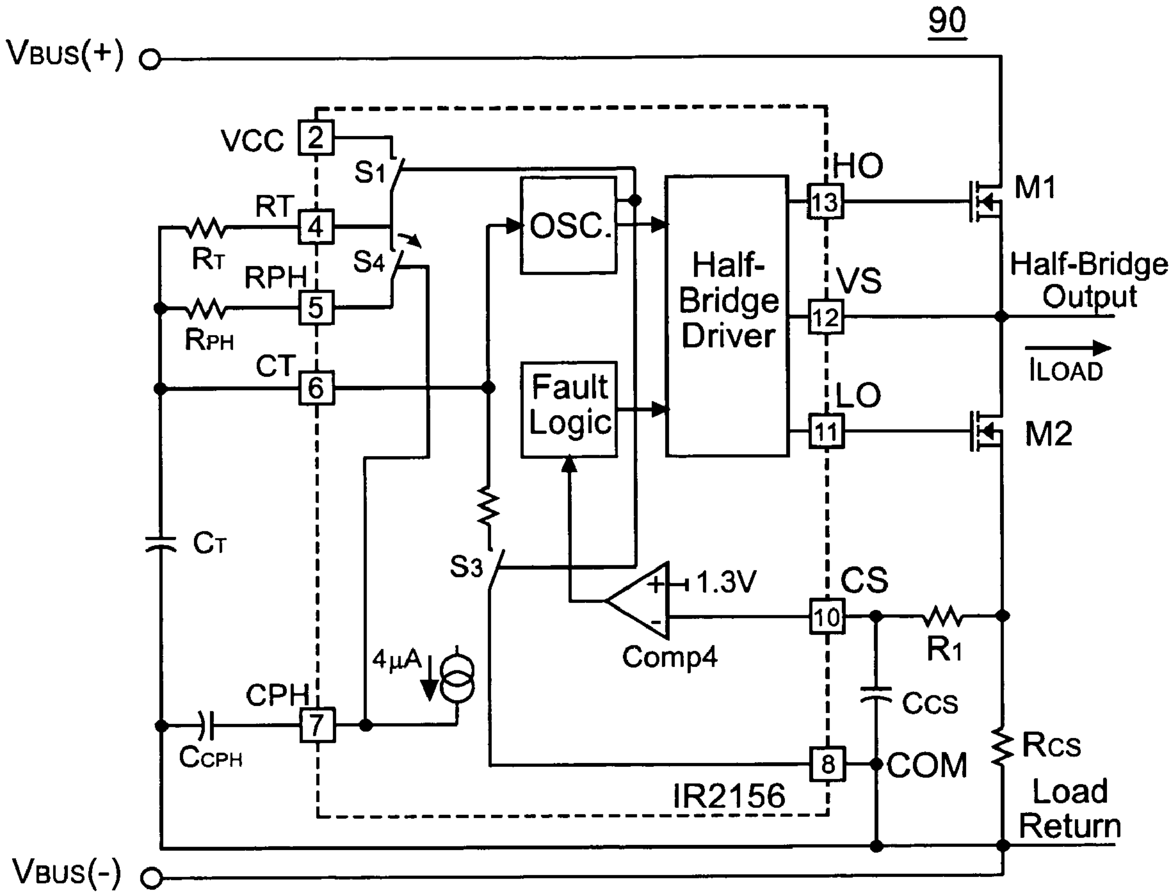
FIG. 9 is a block diagram illustrating an ignition feature for an electronic ballast control.

Referring now to FIG. 9, a circuit diagram for control IC 36 illustrating ignition features is shown generally as circuit 90. During ignition mode, a high voltage is placed across the lamp to obtain ignition of the lamp. In the conventional circuit, as capacitor CPH on pin CPH is charged above 13V, switch S4, which is a P channel MOSFET, begins to slowly turn off, thereby disconnecting resistor RPH from resistor RT in a smooth fashion. The slow turn of switch S4 results in a smooth transition to the running frequency that is determined by the value of resistor RT in combination with other components in the electronic ballast. This switching configuration causes the operating frequency of the electronic ballast to ramp smoothly from preheat frequency through the ignition frequency to the final running frequency in normal mode. This feature is accomplished simply according to the present invention by applying varying digital values to DAC 12 to cause a smooth ramp from preheat frequency to run frequency. Accordingly, the ballast control is simplified by reducing the component count, as described above.

If no ignition of the lamp occurs, the fault condition is detected on pin CS as the voltage determined by the current flowing through the lower half-bridge MOSFET through the external current sensing resistor RCS. The value set for resistor RCS determines the allowable peak ignition current before a fault is determined and control IC 36 reacts accordingly. Preferably, resistor RCS is selected to prevent the peak ignition current from exceeding the current ratings of the output stage MOSFETs. If a fault is detected on pin CS, control IC 36 enters fault mode and disables the gate driver outputs HO and LO.

Upon a successful ignition of the lamp, control IC 36 enters normal run mode and operates the electronic ballast at the desired frequency. At this point, a lamp arc is established and the lamp is driven to a specified power level, as determined by the frequency set by DAC 12. During run mode, if hard switching occurs in the half-bridge, for example due to an open filament or the removal of the lamp, the fault condition is detected through the voltage across the current sensing resistor RCS. This voltage, supplied to pin CS, exceeds an internal threshold of 1.3V in a fault condition, shifting the state of control IC 36 into fault mode. At that point, the gate driver outputs HO and LO are latched into a low condition.

Another fault condition detected by control IC 36 is a low voltage bus condition that may cause the resonant output stage of the electronic ballast to operate at a frequency near or below resonance. This type of operation can produce hard switching in the half-bridge, which can damage the half-bridge switches. Control IC 36 provides a low DC bus voltage protection by pulling down CPH as the bus voltage decreases. By pulling down pin CPH, switch 4 illustrated in FIG. 9 closes, thereby causing the operating frequency to shift to a higher value which is a safe operating point above the resonance frequency. In accordance with the oscillator of the present invention, the decrease in bus voltage causes higher digital values to be applied to DAC 12 to shift the operating frequency above resonance. External resistor RBUS illustrated in FIG. 3 and internal resistor RVDC determine the DC bus level at which the frequency shifting will occur. When a low bus voltage level is detected, the ignition ramp is reset as well. This precaution is taken in the event that the low DC bus voltage levels cause the lamp to extinguish, so that the lamp can be automatically ignited as the DC bus voltage returns to a normal level. Internal resistor RVDC is engaged between pin VDC and COM during preheat mode once the voltage on pin CPH exceeds 7.5V.

Current sensing pin CS in control IC 36 detects a voltage related to current supplied through the switching half-bridge. If the voltage applied to pin CS exceeds 1.3V once the current sense function is enabled in preheat mode, control IC 36 transitions to fault mode and latches the gate driver outputs to a low state. In addition, capacitor CPH is discharged to COM to reset the preheat time and the oscillator is disabled in fault mode. Control IC 36 maintains the fault mode state until voltage VCC is recycled below the UVLO negative going turn off threshold, UVLO−, or until the shutdown pin SD is pulled above 5.1V. When either of these conditions occur, control IC 36 transitions to UVLO mode, where a reinitialization of the electronic ballast may occur. In UVLO mode, with the appropriate operating parameters, control IC 36 will attempt to resume normal operation mode once voltage VCC is above the turn on threshold UVLO+ and the voltage on pin SD is below 4.5V.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An adjustable oscillator circuit for producing a pulsed output, comprising:

a timing capacitor;

an adjustable current source coupled to the capacitor for charging the capacitor at an adjustable rate;

a threshold circuit comprising a comparator for changing a charging or discharging state of the capacitor based on a charge value of the capacitor;

the threshold circuit including a first threshold value circuit providing a first threshold value to the comparator for comparison with the charge value of the capacitor when the capacitor is in a charging state and a second threshold value circuit providing a second threshold value to the comparator for comparison with the charge value of the capacitor when the capacitor is in a discharging state, further comprising a first gating switch coupled between a comparator input and the first threshold value circuit and a second gating switch coupled between the comparator input and the second threshold value circuit, said first and second gating switches being responsive to an output of the comparator to determine which of the first and second threshold values is provided to the comparator input;

a first switch in the adjustable current source operable to vary the current supplied to the capacitor for charging the capacitor at the adjustable rate;

a digital to analog converter coupled to a control input of the first switch and operable to receive input digital data and to provide an analog control signal to the control input of the first switch to vary the current supplied to the capacitor based on the input digital data thereby to charge the capacitor at the adjustable rate determined by the input digital data;

further comprising a second switch coupled to said capacitor for discharging said capacitor and having a control input coupled to the comparator output, said first gating switch providing said first threshold value to the comparator and allowing said capacitor to be charged until the charge value of said capacitor substantially equals said first threshold value, said second gating switch providing said second threshold value to the comparator while said second switch discharges said capacitor and allowing said capacitor to be discharged until said capacitor charge value is substantially equal to said second threshold value.

2. The oscillator circuit according to claim 1, further comprising a passive component coupled to the first switch for setting a minimum amount of current supplied from the current source.

3. An electronic ballast control comprising the oscillator circuit according to claim 1.

* * * * *